United States Patent [19]

Woo et al.

[11] Patent Number: 5,032,801

[45] Date of Patent: Jul. 16, 1991

[54] HIGH PERFORMANCE ATTENUATOR CONFIGURATION

[75] Inventors: James Woo, Portland; Marvin E. LaVoie, Aloha, both of Oreg.

[73] Assignee: Tektronix, Inc., Beaverton, Oreg.

[21] Appl. No.: 560,914

[22] Filed: Jul. 31, 1990

[51] Int. Cl.⁵ .............................................. H03H 7/24
[52] U.S. Cl. .................... 333/81 R; 333/103; 330/51
[58] Field of Search ............ 333/103, 101, 104, 81 R, 333/81 A, 354; 330/51; 328/152, 154; 307/242

[56] References Cited

U.S. PATENT DOCUMENTS 3,015,790  1/1962  Eisaman et al. ............... 323/354 X
4,572,967  2/1986  Metz .............................. 328/154 X
4,833,400  5/1989  Boutigny ........................ 330/51 X

*Primary Examiner*—Paul Gensler
*Attorney, Agent, or Firm*—Francis I. Gray

[57] ABSTRACT

A high performance attenuator configuration divides a signal path into a plurality of parallel attenuator paths, each path having a predetermined attenuation value. A switch for each attenuator path is provided to couple selectively one of the attenuator paths to an input connector. Each attenuator path has an FET buffer amplifier, and the outputs of the FET buffer amplifiers are input to an electronic switch or multiplexer. The electronic switch selects the FET buffer amplifier output to be passed on to an output drive circuit.

4 Claims, 2 Drawing Sheets

HIGH PERFORMANCE ATTENUATOR CONFIGURATION

BACKGROUND OF THE INVENTION

The present invention relates to attenuation circuits, and more particularly to a high performance attenuator configuration that makes use of integrated junction field effect transistors to integrate functions that previously required mechanical switches.

Because of the requirement that one Megohm oscilloscopes have to be able to withstand input voltages up to one Kilovolt while having only microamperes of leakage, electro-mechanical relays are required to switch various attenuator functions. As shown in FIG. 1 current designs have at least four relay contacts in a signal path between an input connector and an FET preamplifier, with some instruments having many more. These relay switches often are responsible for much of the loss of signal fidelity; they represent a large part of the total attenuator cost since they are required to have low capacitance to ground, low inductance and small size; and they represent the least reliable component on many oscilloscopes.

What is desired is a high performance attenuator configuration that reduces the number of relay switches in the signal path to provide higher bandwidth, lower cost and increased reliability.

SUMMARY OF THE INVENTION

Accordingly the present invention provides a high performance attenuator configuration that separates a signal path into a plurality of parallel paths. Each path provides a different amount of attenuation to an input signal. Each path has a buffer amplifier. The outputs of the buffer amplifiers are input to an electronic switch or multiplexer, and one of the paths is selected for output. The output is then input to a driver amplifier before being forwarded for further processing and/or display.

The objects, advantages and other novel features of the present invention are apparent from the following detailed description when read in conjunction with the appended claims and attached drawing.

DESCRIPTION OF THE PREFERRED EMBODIMENT

Figure 2:
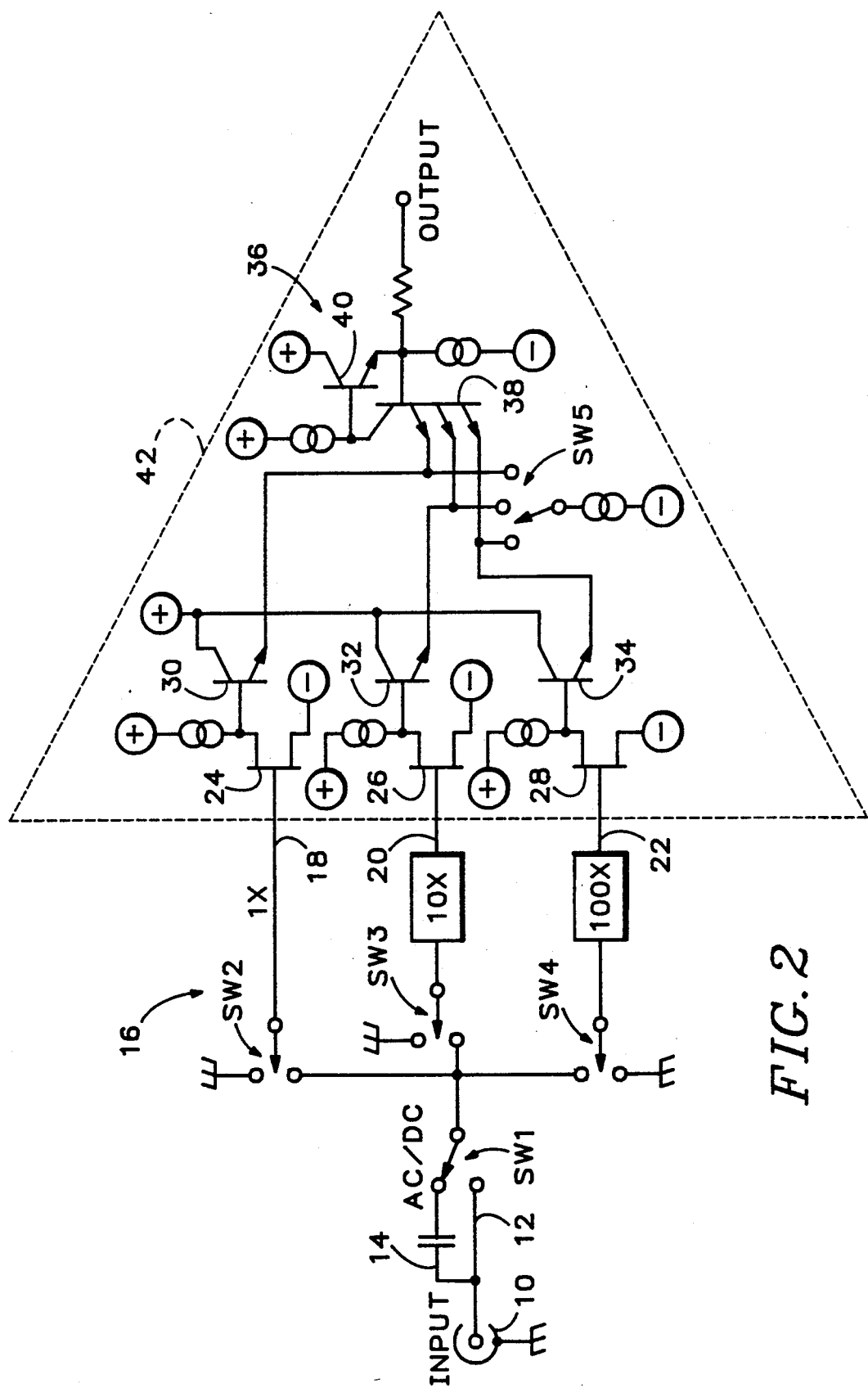
FIG. 2 is a schematic diagram of a high performance attenuator configuration according to the present invention.

Referring now to FIG. 2 an input signal is applied to an input connector 10. The input signal from the connector 10 is applied to either a d.c. path 12 or an a.c. path 14. A first switch SW1, which is of the conventional electro-mechanical variety, selects which of the d.c. or a.c. paths to pass on to the attenuator section 16. The attenuator section 16 has a plurality of attenuator paths 18, 20, 22 for each fixed attenuator value. The attenuator paths 18, 20, 22 are coupled to the input signal path from SW1 via respective switches SW2, SW3, SW4, again of the conventional electro-mechanical type. The attenuator paths 18, 20, 22 terminate in respective FET buffer amplifiers 24, 26, 28. The outputs of the FET buffer amplifiers 24, 26, 28 are selectively coupled via respective switch transistors 30, 32, 34 to a driver stage 36. Switch transistors 30, 32, 34 together with an input transistor 38 for the driver stage 36 and an emitter-follower configured output transistor 40 form one possible type of multiple input buffer with high input impedance and low output impedance. When bias current via switch SW5 is supplied to switch transistor 30, but not transistors 32, 34, the selected switch transistor forms a unity gain feedback amplifier with the buffer transistors 38, 40. Output transistor 40 provides sufficient current to drive low impedance loads, while the base of input transistor 38 samples the output and provides feedback. Similarly switch transistors 32, 34 may be independently enabled to form the unity gain feedback amplifier with buffer transistors 38, 40.

Figure 1:
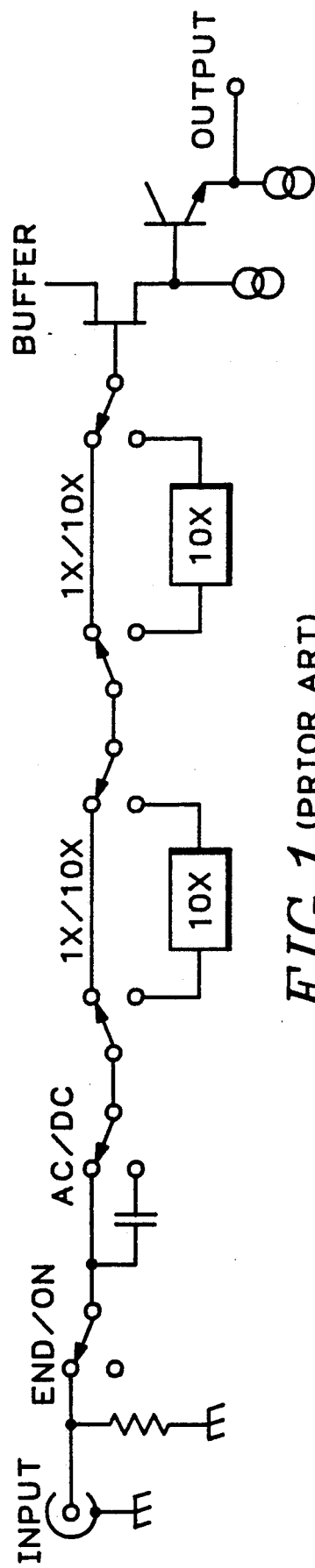
FIG. 1 is a schematic diagram of a prior art attenuator configuration.

In operation an operator selects either an a.c. or d.c. coupled input via switch SW1. Then by selecting one of the switches SW2, SW3 or SW4 and the appropriate setting of SW5 the desired attenuation path is inserted between the input connector 10 and the driver 36. As is apparent by comparing the configuration of FIG. 2 with the prior art configuration of FIG. 1 the number of electro-mechanical relay switches in the signal path between the input connector 10 and the FET buffer amplifiers 24, 26, 28 is reduced from six to two. This translates into increased bandwidth, lower cost and greater reliability. The electronic circuitry may be realized within a single integrated circuit 42.

Thus the present invention provides a high performance attenuator configuration that has fewer expensive relay switches, greater bandwidth and increased reliability by providing parallel attenuator paths with an electronic switch to select which path is passed from the FET buffer amplifiers to the output drive circuit.

What is claimed is:

1. An attenuator circuit comprising:
   a plurality of parallel paths, each path providing a different predetermined amount of attenuation;
   separate means in each separate parallel path for coupling an input signal to a selected one of the parallel paths; and
   means for electronically switching the selected one of the parallel paths to an output driver.

2. An attenuator circuit as recited in claim 1 wherein the switching means comprises:
   a plurality of switch transistors, one for each parallel path, each switch transistor being selectively coupled with the output driver to form a unity gain feedback amplifier that has a high input impedance and a low output impedance; and
   means for selecting one of the switch transistors to be coupled with the output driver to form the unity gain feedback amplifier.

3. An attenuator circuit as recited in claim 2. wherein the switching means further comprises a buffer amplifier between each parallel path and the input terminal o the corresponding switch transistor.

4. An attenuator circuit as recited in claim 1 wherein the output driver comprises:
   an input transistor having a plurality of input terminals, each input terminal being coupled to a separate one of the parallel paths; and
   an output emitter-follower transistor coupled to the output terminal of the input transistor, the emitter of the output emitter-follower transistor being coupled to the control terminal of the input transistor to provide feedback.

* * * * *